(12) United States Patent
Kikai et al.

(10) Patent No.: US 11,256,172 B2
(45) Date of Patent: Feb. 22, 2022

(54) LIGHT IRRADIATING DEVICE, LIGHT IRRADIATING METHOD AND RECORDING MEDIUM

(71) Applicant: Tokyo Electron Limited, Tokyo (JP)

(72) Inventors: Takaya Kikai, Koshi (JP); Norihisa Koga, Koshi (JP); Masaru Tomono, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/910,209

(22) Filed: Jun. 24, 2020

(65) Prior Publication Data

US 2020/0409269 A1    Dec. 31, 2020

(30) Foreign Application Priority Data

Jun. 27, 2019 (JP) .............................. JP2019-120330

(51) Int. Cl.
  *G03B 27/54* (2006.01)
  *G03F 7/20* (2006.01)
  *H01L 21/027* (2006.01)

(52) U.S. Cl.
  CPC .......... *G03F 7/2051* (2013.01); *H01L 21/027* (2013.01)

(58) Field of Classification Search
  CPC .... G03F 7/2022; G03F 7/2024; G03F 7/2051; G03F 7/40; G03F 7/2002; G03F 7/70908; G03F 7/2004; H01L 21/027; H01L 21/0273; H01L 21/67253
  See application file for complete search history.

(56) References Cited

U.S. PATENT DOCUMENTS

| 5,215,588 | A | * | 6/1993 | Rhieu | ............... C23C 16/45519 118/715 |
| 2013/0068970 | A1 | * | 3/2013 | Matsushita | ......... H01L 21/6719 250/492.2 |
| 2016/0282725 | A1 | * | 9/2016 | Miyagi | ................... G03F 7/708 |
| 2019/0267262 | A1 | * | 8/2019 | Aoyama | ........... H01L 21/67115 |
| 2019/0361351 | A1 | * | 11/2019 | Koga | ........................ G03F 7/40 |

FOREIGN PATENT DOCUMENTS

JP    2001127037 A    5/2001

* cited by examiner

*Primary Examiner* — Peter B Kim
(74) *Attorney, Agent, or Firm* — Pearne & Gordon LLP

(57) ABSTRACT

A light irradiating device includes a processing chamber in which a substrate is accommodated; a beam source chamber in which a beam source of an energy beam is accommodated; a partition wall configured to partition the processing chamber and the beam source chamber; multiple window members provided at the partition wall to transmit the energy beam outputted from the beam source toward the substrate within the processing chamber; and multiple gas discharge units respectively disposed around the multiple window members within the processing chamber, and configured to discharge an inert gas along surfaces of the multiple window members.

7 Claims, 10 Drawing Sheets

LIGHT IRRADIATING DEVICE, LIGHT IRRADIATING METHOD AND RECORDING MEDIUM

CROSS-REFERENCE TO RELATED APPLICATION

This application claims the benefit of Japanese Patent Application No. 2019-120330 filed on Jun. 27, 2019, the entire disclosure of which is incorporated herein by reference.

TECHNICAL FIELD

The various aspects and embodiments described herein pertain generally to a light irradiating device, a light irradiating method and a recording medium.

BACKGROUND

Patent Document 1 describes a manufacturing process for a semiconductor device. In this manufacturing process, a process of forming a resist film on a surface of a substrate, a process of performing exposure, a process of patterning the resist, a process of irradiating light having a wavelength equal to or less than 200 nm to the entire surface of the resist and a process of etching an underlying film of the resist film are performed in sequence.

Patent Document 1: Japanese Patent Laid-open Publication No. 2001-127037

SUMMARY

In one exemplary embodiment, a light irradiating device includes a processing chamber in which a substrate is accommodated; a beam source chamber in which a beam source of an energy beam is accommodated; a partition wall configured to partition the processing chamber and the beam source chamber; multiple window members provided at the partition wall to transmit the energy beam outputted from the beam source toward the substrate within the processing chamber; and multiple gas discharge units respectively disposed around the multiple window members within the processing chamber, and configured to discharge an inert gas along surfaces of the multiple window members.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
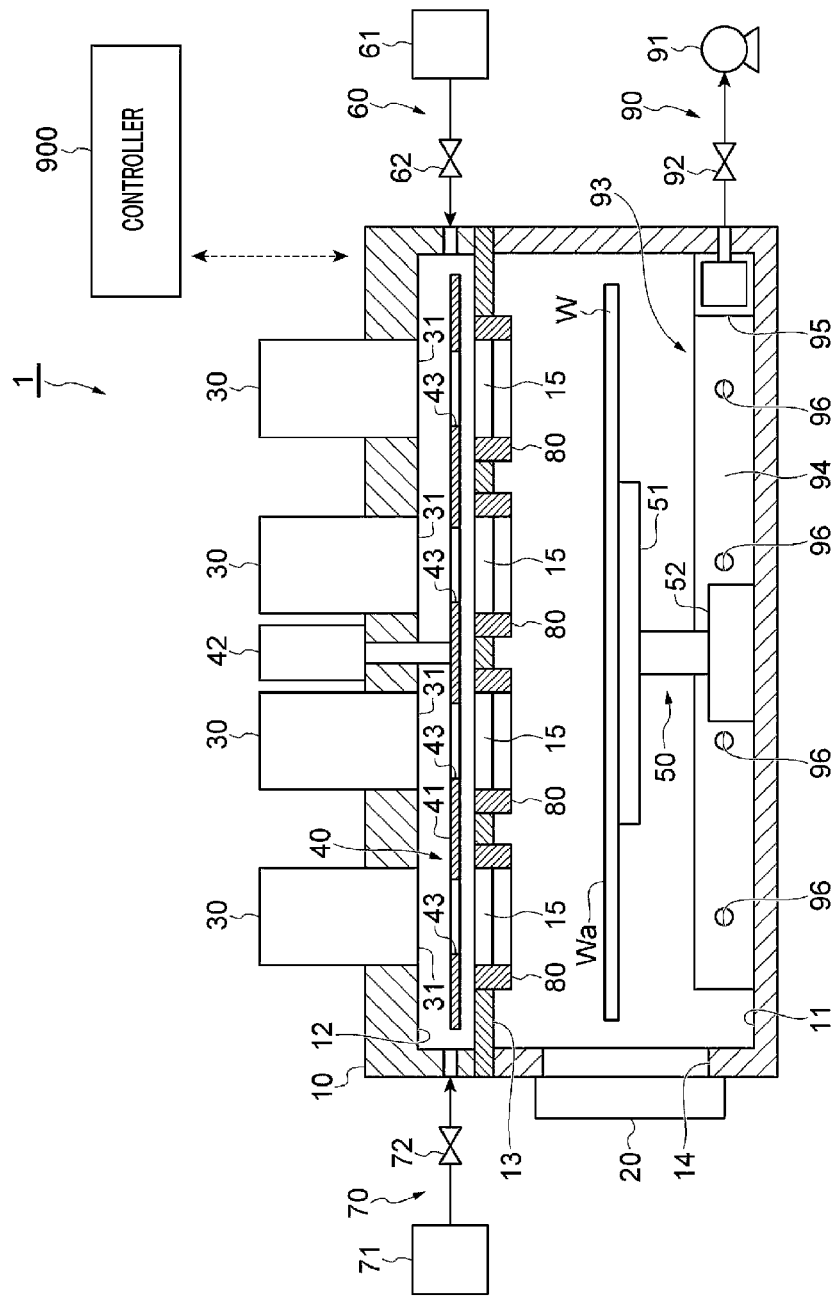
FIG. 1 is a schematic diagram illustrating an example of a schematic configuration of a light irradiating device.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the description, same parts or parts having same functions will be assigned same reference numerals, and redundant description will be omitted.

[Light Irradiating Device]

(Overall Configuration of Device)

A light irradiating device 1 according to an exemplary embodiment is a device configured to irradiate an energy beam to a photosensitive pattern or a photosensitive film formed on a surface of a substrate. As a specific example of the substrate, a semiconductor wafer may be used. As a specific example of the photosensitive film, a resist film may be used. As a specific example of the photosensitive pattern, a resist pattern formed by a developing processing of the resist film may be used.

By way of example, the light irradiating device 1 irradiates the energy beam to improve roughness of a front surface of the resist film, roughness of a front surface of the resist pattern or roughness of a side surface of the resist pattern. Hereinafter, the resist film and the resist pattern will be referred to as "resist" together. Further, the front surface of the resist film, the front surface of the resist pattern and the side surface of the resist pattern will be referred to as "surface of resist" together. An amplitude, a wavelength, and so forth of the energy beam are not particularly limited as long as the energy beam causes, on the resist pattern, a reaction in which a sublimate is generated. As a specific example of the energy beam, vacuum ultraviolet light (VUV light) may be used.

As depicted in FIG. 1, the light irradiating device 1 includes a housing 10, a gate 20, a plurality of beam sources 30, a shutter 40, a rotating/holding unit 50, a processing gas supply 70, an atmosphere gas supply 60, a plurality of gas discharge units 80, and a gas exhaust unit 90.

The housing 10 is a vessel for isolating an internal space thereof from an external space. The inside of the housing 10 is vertically partitioned into two regions by a horizontal partition wall 13, and a region under the partition wall 13 is configured as a processing chamber 11 whereas a region above the partition wall 13 is configured as a beam source chamber 12. That is, the light irradiating device 1 is equipped with the partition wall 13 which splits the inside of the housing 10 into the processing chamber 11 and the beam source chamber 12. The processing chamber 11 accommodates therein a wafer W as a processing target. A carry-in/out opening 14 through which the wafer W is carried into/from the inside of the processing chamber 11 is formed at a sidewall of the housing 10. The gate 20 is configured to open or close the carry-in/out opening 14 by using, for example, an electric motor or an air cylinder as a power source.

The beam source chamber 12 accommodates therein the plurality of beam sources 30. Each beam source 30 incorporates therein an energy beam generator and outputs an energy beam generated from the generator in one direction. By way of example, the beam source 30 is a deuterium lamp, and outputs a vacuum ultraviolet ray. The beam source 30 may output an energy beam including both a vacuum ultraviolet ray and a near ultraviolet ray having a wavelength larger than that of the vacuum ultraviolet ray. The vacuum ultraviolet ray is a light having a wavelength ranging from 10 nm to 200 nm, and the near ultraviolet ray is a light having a wavelength ranging from 300 nm to 400 nm. By way of non-limiting example, the beam source 30 outputs an energy beam having a continuous spectrum distribution within a range from 115 nm to 400 nm. A peak of the spectrum distribution exists at a wavelength of, e.g., 150 nm to 160 nm.

The beam sources 30 are arranged in the horizontal direction and fixed to a ceiling portion of the housing 10 with output units 31 for the energy beam facing the partition wall 13 (for example, facing vertically downwards). Here, the accommodating the beam source 30 implies accommodating at least the output unit 31 of the beam source 30, and the meaning thereof is not necessarily limited to accommodating the entire beam source 30.

The partition wall 13 is provided with, at a plurality of portions thereof respectively corresponding to the output units 31 of the plurality of beam sources 30, a plurality of window members 15 each of which is configured to transmit the energy beam outputted from the beam source 30. With this configuration, the energy beam outputted from the beam source 30 is irradiated to the wafer W within the processing chamber 11. That is, the light irradiating device 1 is equipped with the plurality of window members 15 provided at the partition wall 13 to transmit the energy beams outputted from the plurality of beam sources 30 toward the wafer W within the processing chamber 11.

If the energy beam is irradiated to a resist on a front surface Wa of the wafer W, a part of chemical bonds in a surface layer of the resist is cut. Accordingly, surface free energy of the resist is reduced, and an internal stress of the surface layer of the resist is reduced. As a result, fluidity of the surface layer of the resist is increased, so that the roughness of the surface of the resist is increased.

In the state that the beam sources 30 are turned on, the shutter 40 is configured to perform a switchover between an open state in which the light outputted from the beam source 30 is irradiated to the wafer W and a closed state in which the light outputted from the beam source 30 is not irradiated to the wafer W. By way of example, the shutter 40 includes a light blocking plate 41 and an opening/closing driving unit 42. The light blocking plate 41 is disposed in parallel with the partition wall 13 within the beam source chamber 12. The light blocking plate 41 has a plurality of light transmission openings 43 through which the energy beams outputted from the plurality of beam sources 30 are transmitted.

The opening/closing driving unit 42 is configured to allow the open state and the closed state to be switched by moving the light blocking plate 41 so that the positions of the light transmission openings 43 are deviated. In the open state, the light transmission openings 43 are located under the corresponding beam sources 30. Accordingly, the light outputted from the beam sources 30 are irradiated to the wafer W within the processing chamber 11 via the light transmission openings 43 and the window members 15. In the closed state, portions of the light blocking plate 41 where no light transmission opening 43 is provided are respectively located under the beam sources 30. Accordingly, the light outputted from the beam sources 30 is blocked within the beam source chamber 12.

The rotating/holding unit 50 is configured to hold and rotate the wafer W accommodated within the processing chamber 11. By way of example, the rotating/holding unit 50 is equipped with a holder 51 and a rotation driving unit 52. The holder 51 is configured to support the wafer W which is placed horizontally within the processing chamber 11 and holds this wafer W by evacuation or the like. The rotational driving unit 52 is configured to rotate the holder 51 around a vertical axis. As the holder 51 is rotated, the wafer W held by the holder 51 is also rotated.

The processing gas supply 70 (gas supply) is configured to supply an inert gas (hereinafter, referred to as "processing gas") into the processing chamber 11 and the beam source chamber 12 at least within a period during which the energy beam is irradiated to the wafer W within the processing chamber 11. As a specific example of the processing gas, an argon gas, a helium gas, a xenon gas, a nitrogen gas, or the like may be used. Supplying the processing gas into the processing chamber 11 and the beam source chamber 12 includes supplying the processing gas into the beam source chamber 12 via the processing chamber 11 and supplying the processing gas into the processing chamber 11 via the beam source chamber 12. By supplying the processing gas into the processing chamber 11, deterioration of the resist, which might be caused by a chemical reaction between the resist and the atmosphere within the processing chamber 11, can be suppressed. By supplying the processing gas into the beam source chamber 12, ozone generation within the beam source chamber 12 is suppressed.

By way of example, the processing gas supply 70 includes a gas source 71 and a valve 72. The gas source 71 sends the processing gas into the processing chamber 11 and the beam source chamber 12. The valve 72 is operated in response to a control signal, and opens or closes a gas supply path into the processing chamber 11 and the beam source chamber 12 from the gas source 71. As a specific example, the valve 72 may be an electronic valve, an air operation valve, or the like.

The atmosphere gas supply 60 is configured to supply an inert gas (hereinafter, referred to as "atmosphere gas") into the beam source chamber 12 at least within a period during which the gate 20 is open. As a specific example, the atmosphere gas may be a nitrogen gas or the like. By supplying the atmosphere gas, the ozone generation within the beam source chamber 12 is suppressed even in the period during which the gate 20 is open.

By way of example, the atmosphere gas supply 60 includes a gas source 61 and a valve 62. The gas source 61 sends the atmosphere gas into the beam source chamber 12. The valve 62 is operated in response to a control signal, and opens or closes a gas supply path into the beam source chamber 12 from the gas source 61. As a specific example, the valve 62 may be an electronic valve, an air operation valve, or the like.

The gas discharge units 80 are respectively disposed around the plurality of window members 15 within the processing chamber 11, and discharge the inert gas along surfaces of the window members 15. By way of example, the gas discharge unit 80 discharges the processing gas supplied by the processing gas supply 70 along the surface of the corresponding window member 15. For example, the gas discharge unit 80 is disposed to surround the corresponding window member 15 and discharges the processing gas toward a center 15a of the corresponding window member 15 from a periphery thereof.

The gas exhaust unit 90 is configured to guide the processing gas gathered at the center 15a of the window member 15 from the gas discharge unit 80 toward the wafer W (lower side) within the light irradiating device 1 and exhausts the processing gas to the outside of the processing chamber 11. By way of example, the gas exhaust unit 90 includes an exhaust pump 91 and a valve 92. The exhaust pump 91 is, by way of non-limiting example, an electromotive vacuum pump and is configured to suck out the gas from a lower portion of the processing chamber 11. The valve 92 is configured to open or close a gas exhaust path from the processing chamber 11 into the exhaust pump 91.

(Gas Discharge Unit)

Figure 2:
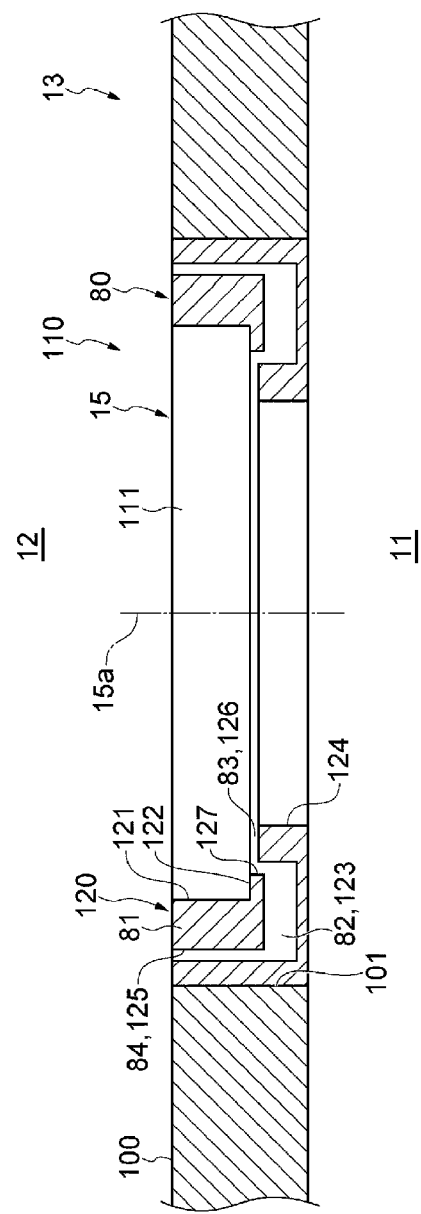
FIG. 2 is a schematic diagram illustrating an example of a schematic configuration of a gas discharge unit.

Now, a configuration of the gas discharge unit 80 will be described in detail. As depicted in FIG. 2, the gas discharge unit 80 includes a surrounding member 81, a buffer space 82, a slit 83 and a vent hole 84. The surrounding member 81 is provided at the partition wall 13 to surround a surface of the window member 15. An annular portion of the surrounding member 81 surrounding the surface of the window member 15 is protruded toward the wafer W (lower side) to be positioned lower than the surface of the window member 15 is.

The buffer space 82 is provided within the surrounding member 81 to surround the surface of the window member 15. Since the buffer space 82 needs to surround the surface of the window member 15 partially at least, the buffer space 82 need not necessarily be provided in an annular shape along the entire circumference of the window member 15. The slit 83 is opened to an inner peripheral surface of the surrounding member 81 along a periphery of the surface of the window member 15 to allow the inert gas to be discharged toward the center 15a of the window member 15 from the buffer space 82. The vent hole 84 is provided at the partition wall 13 to introduce the inert gas into the buffer space 82 from the beam source chamber 12. That is, the vent hole 84 is formed through the partition wall 13 to reach the beam source chamber 12 from the buffer space 82.

As an example, the partition wall 13 is provided with a wall main body 100 and a plurality of window units 110. The wall main body 100 is elongated horizontally and partitions the inside of the housing 10 into the processing chamber 11 and the beam source chamber 12. The wall main body 100 is provided with a plurality of openings 101 respectively corresponding to the plurality of window members 15. The plurality of window units 110 are respectively fitted into the plurality of openings 101 to constitute the window members 15 and the gas discharge units 80.

Each window unit 110 has a transparent circular plate 111 and a plate holder 120. The transparent circular plate 111 is a circular plate which transmits the energy beam. By way of example, the transparent circular plate 111 is composed of inorganic glass, organic glass, or the like. As an example, the transparent circular plate 111 is made of magnesium fluoride glass.

The plate holder 120 holds the transparent circular plate 111 within the opening 101. The plate holder 120 has a frame portion 121 and a plate supporting portion 122. The frame portion 121 is an annular portion surrounding an outer peripheral surface of the transparent circular plate 111 along the entire circumference thereof. The plate supporting portion 122 is an annular portion disposed under the frame portion 121. An inner peripheral surface of the plate supporting portion 122 is protruded inwards more than an inner peripheral surface of the frame member 121. A portion of the plate supporting portion 122 protruded inwards more than the inner peripheral surface of the frame portion 121 supports a peripheral portion of the transparent circular plate 111 from below. With this configuration, the window member 15 is formed at an inner side than the inner peripheral surface of the plate supporting portion 122, and the plate supporting portion 122 is configured as the surrounding member 81 which surrounds the surface of the window member 15.

An annular space 123 is formed within the plate supporting portion 122 along the entire circumference thereof. In the plate supporting portion 122, a wall portion 124 provided at an inner side than the annular space 123 is slightly spaced apart from a bottom surface of the transparent circular plate 111. Accordingly, a gap 126 formed between the transparent circular plate 111 and the wall portion 124 communicates with the annular space 123 along the entire circumference thereof through a cylindrical slit 127 formed along a periphery of the wall portion 124.

The frame portion 121 is provided with at least one vent hole 125 extending between the beam source chamber 12 and the annular space 123. Multiple vent holes 125 may be formed at multiple positions surrounding the transparent circular plate 111. In this configuration, the annular space 123 corresponds to the buffer space 82, and the gap 126 corresponds to the slit 83, and the vent hole 125 corresponds to the vent hole 84.

With the above-described configuration, the processing gas to be discharged to the gas discharge unit 80 can be supplied from the beam source chamber 12. Accordingly, the aforementioned processing gas supply 70 is connected to the beam source chamber 12 (see FIG. 1).

(Modification Example of Partition Wall and Gas Discharge Unit)

Figure 3:
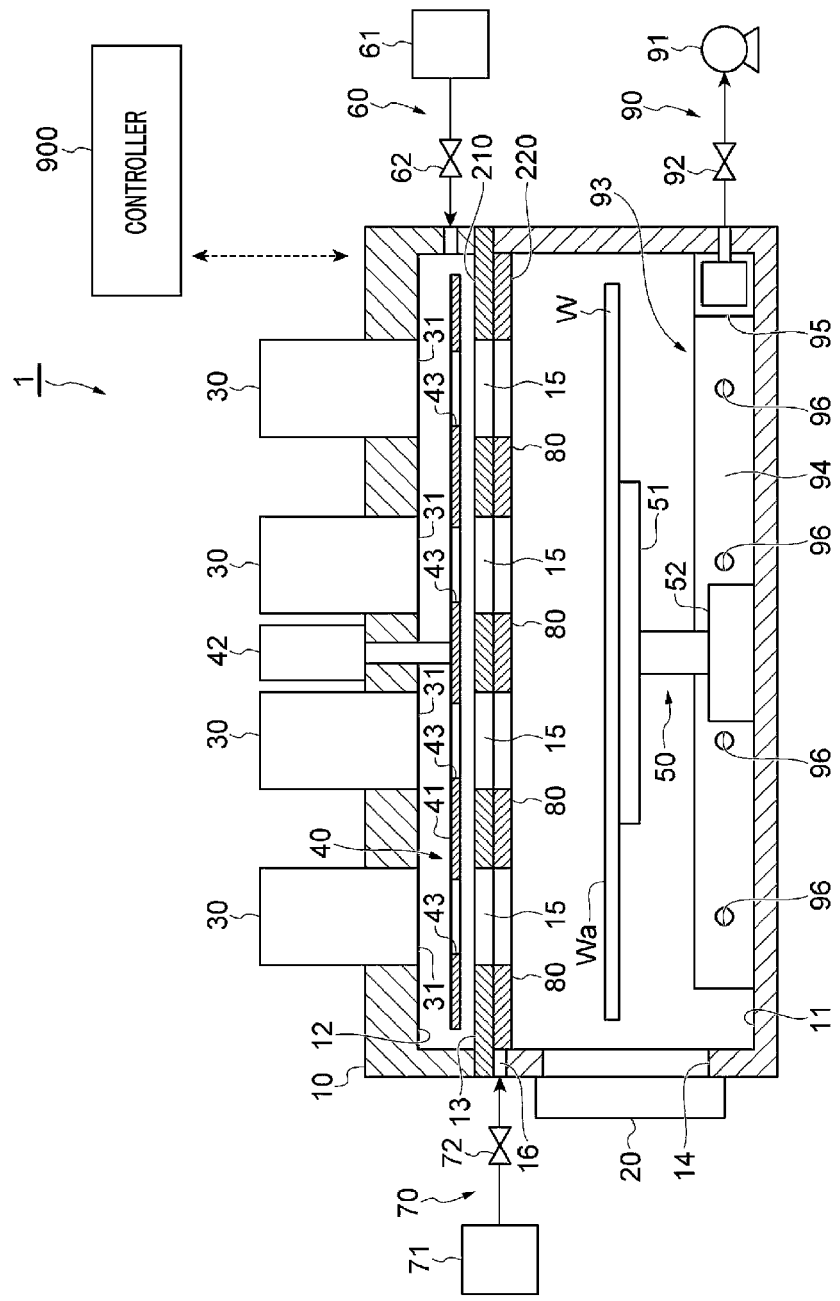
FIG. 3 is a schematic diagram illustrating a modification example of the light irradiating device.
Figure 4:
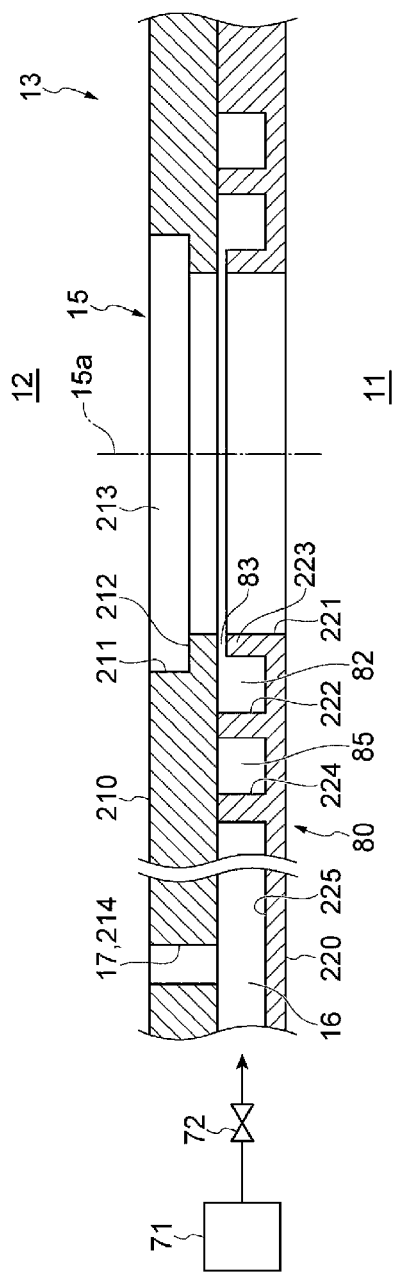
FIG. 4 is a schematic diagram illustrating a modification example of the gas discharge unit.
Figure 5:
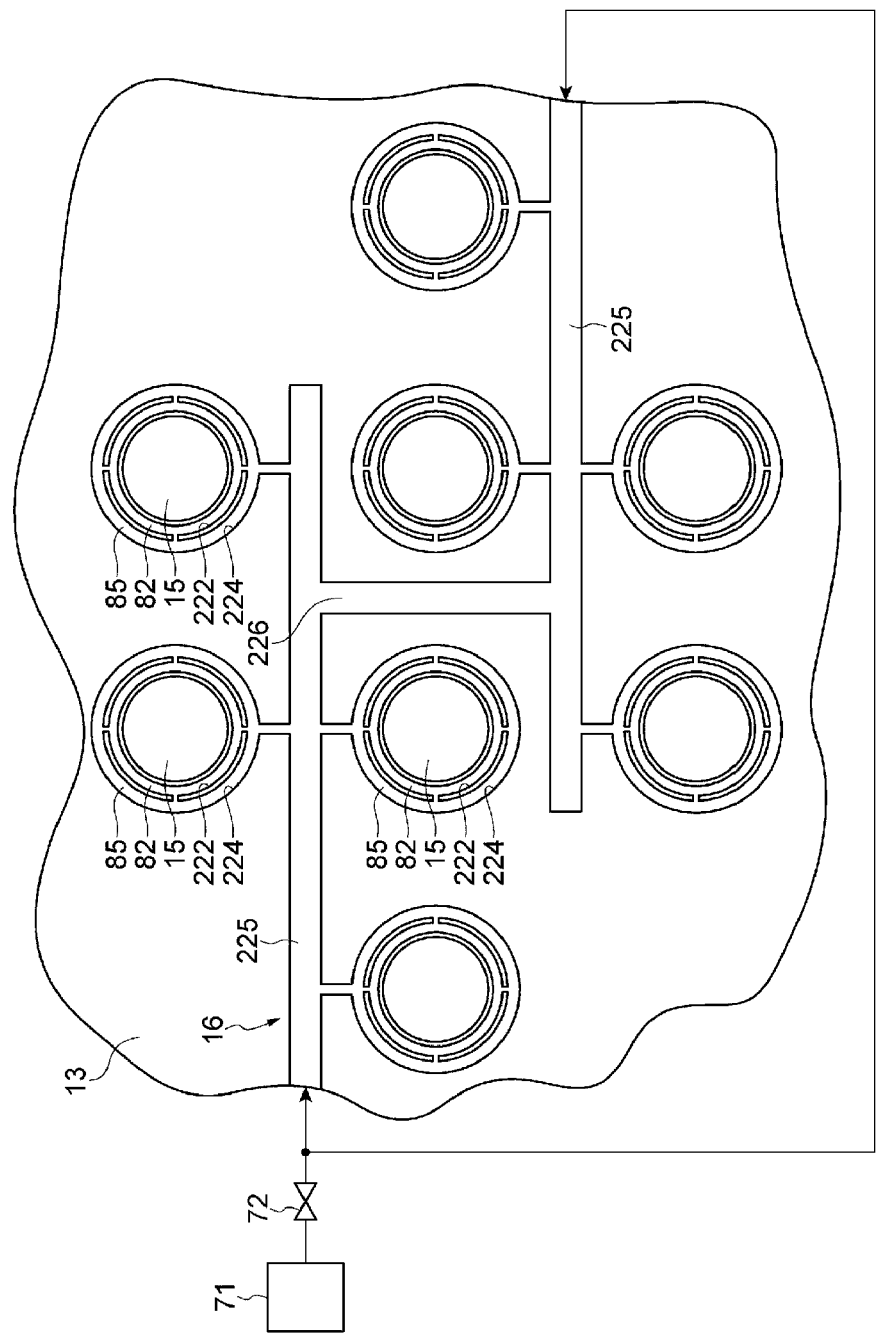
FIG. 5 is a plan view illustrating the modification example of the gas discharge unit.

In the above description, the processing gas is supplied from the beam source chamber 12 into the buffer space 82. However, the exemplary embodiment is not limited thereto. By way of example, as depicted in FIG. 3 to FIG. 5, the light irradiating device 1 may be configured to supply the processing gas into the buffer space 82 through a gas flow passage 16 formed along the partition wall 13. The gas flow passage 16 is formed within the partition wall 13. The partition wall 13 may be provided with at least one vent hole 17 extending between the gas flow passage 16 and the beam source chamber 12. In this configuration, the gas discharge unit 80 does not have the vent hole 84.

The gas discharge unit 80 may be configured to supply the processing gas into the buffer space 82 through a buffer space 85 (second buffer space) formed within the surrounding member 81 to further surround the buffer space 82 (first buffer space). In this case, the gas flow passage 16 is connected to the buffer space 85 at at least one position, and the buffer space 82 and the buffer space 85 may be connected at multiple positions surrounding the window member 15. The number of the connection position(s) between the gas flow passage 16 and the buffer space 85 may be smaller than the number of the connection positions between the buffer space 82 and the buffer space 85.

The partition wall 13 includes a first partition wall 210 and a second partition wall 220 overlapped with the first partition wall 210 at the processing chamber 11 side. The first partition wall 210 and the second partition wall 220 are in contact with each other. The first partition wall 210 has an opening 211, a plate supporting portion 212 and a transparent circular plate 213 at each of multiple positions respectively corresponding to the window members 15. The plate supporting portion 212 is protruded inwards from a lower portion of an inner peripheral surface of the opening 211 along the entire circumference thereof. The transparent circular plate 213 is a circular plate configured to transmit the energy beam, the same as the aforementioned transparent circular plate 111. The transparent circulate plate 213 is fitted into the opening 211 to be supported by the plate supporting portion 212.

The second partition wall 220 is provided with a plurality of openings 221 respectively corresponding to the openings 211. As shown in FIG. 4 and FIG. 5, on a top surface of the second partition wall 220, a first annular groove 222 and a second annular groove 224 are formed around each opening 221. The first annular groove 222 surrounds the opening 221 along the entire circumference thereof, and the second annular groove 224 surrounds the first annular groove 222 along the entire circumference thereof.

The first annular groove 222 and the second annular groove 224 are connected at multiple positions (four positions in the shown example) surrounding the opening 221. A wall portion 223 provided at an inner side than the first annular groove 222 is slightly spaced apart from a bottom surface of the first partition wall 210. At least one (for example, two) linear groove 225 is further formed on the top surface of the second partition wall 220 to extend between the second annular grooves 224. Each of the second annular grooves 224 is connected to any one linear groove 225 at a single position. A linear groove 226 connecting the linear grooves 225 may be further formed on the top surface of the second partition wall 220. For each linear groove 225, at least one vent hole 214 extending between the inside of the linear groove 225 and the beam source chamber 12 is formed at the first partition wall 210.

In this configuration, the inside of the first annular groove 222 corresponds to the aforementioned buffer space 82, and the inside of the second annular groove 224 corresponds to the aforementioned buffer space 85. Further, a gap formed between the wall portion 223 and the first partition wall 210 corresponds to the slit 83. Furthermore, the inside of the linear groove 225 corresponds to the gas flow passage 16, and the vent hole 214 corresponds to the vent hole 17.

In the above-described configuration, the processing gas to be supplied into the processing chamber 11 from the gas discharge unit 80 and the processing gas to be supplied into the beam source chamber 12 can be both supplied from the gas flow passage 16. Thus, the aforementioned processing gas supply 70 is connected to the gas flow passage 16 (see FIG. 3).

(Exhaust Guide Unit)

Figure 6:
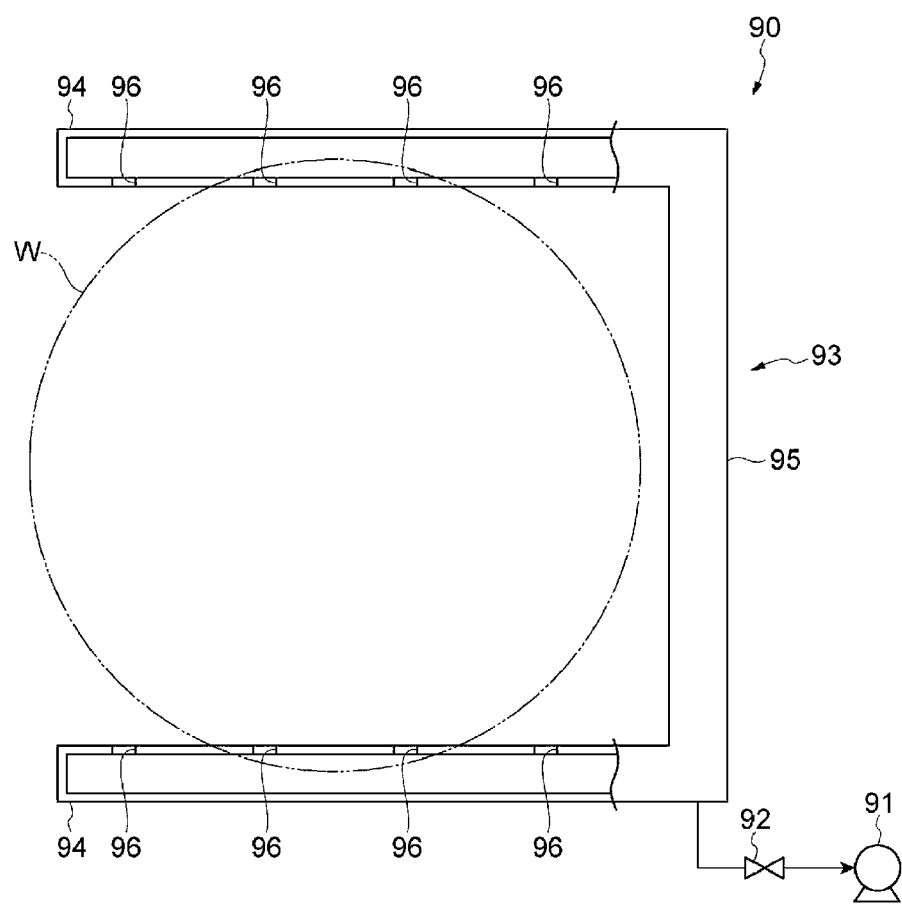
FIG. 6 is a schematic diagram illustrating a schematic configuration of an exhaust guide unit.

As depicted in FIG. 6, for example, the gas exhaust unit 90 may be further equipped with an exhaust guide unit 93 configured to guide the gas into the exhaust pump 91 from multiple positions surrounding a placement region of the wafer W within the processing chamber 11. By way of example, the exhaust guide unit 93 includes two gas exhaust lines 94 arranged to face with each other with the placement region of the wafer W therebetween; and a connection line 95 connecting end portions of the two gas exhaust lines 94. Each gas exhaust line 94 is provided with a multiple number of exhaust openings 96 arranged in a lengthwise direction thereof. Each exhaust opening 96 is opened to, for example, the placement region of the wafer W. The connection line 95 is connected to the exhaust pump 91 via the valve 92.

With this exhaust guide unit 93, the gas is guided into the exhaust pump 91 from multiple positions where the exhaust openings 96 are formed. Accordingly, since the gas is sucked out from a wide range in the lower portion of the processing chamber 11, the processing gas discharged from the gas discharge unit 80 can be guided to the wafer W side (lower side) more securely.

(Controller)

The light irradiating device 1 may be further equipped with a controller 900. The controller 900 is configured to control the shutter 40 to allow the energy beam to be irradiated to the wafer W within the processing chamber 11 from the beam source 30 through the window members 15, and, further, to control the processing gas supply 70 and the gas exhaust unit 90 to discharge the inert gas along the surfaces of the plurality of window members 15 from the plurality of gas discharge units 80 at least in the period during which the energy beam is irradiated to the wafer W.

Figure 7:
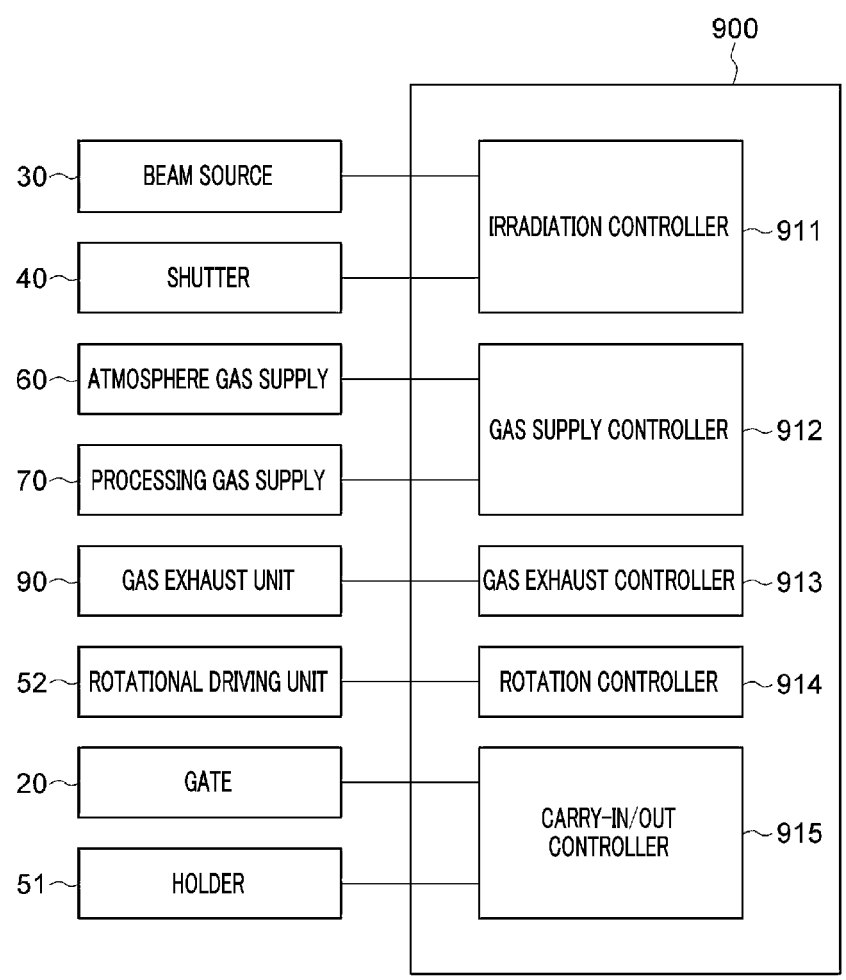
FIG. 7 is a block diagram illustrating an example of a functional configuration of a controller.

FIG. 7 is a block diagram illustrating components functionally equivalent to the controller 900. As shown in FIG. 7, the controller 900 includes, as functional components (hereinafter, referred to as "functional blocks"), an irradiation controller 911, a gas supply controller 912, a gas exhaust controller 913, a rotation controller 914, and a carry-in/out controller 915.

The irradiation controller 911 is configured to turn on the beam source 30 when the light irradiating device 1 is driven and turn off the beam source 30 when the light irradiating device 1 is stopped. Further, the irradiation controller 911 is configured to switch the open state and the closed state by the shutter 40 in a period during which the beam source 30 is turned on.

The gas supply controller 912 is configured to supply the atmosphere gas into the beam source chamber 12 by the atmosphere gas supply 60 at least in a period during which the gate 20 is opened, and configured to supply the processing gas into the beam source chamber 12 and the processing chamber 11 by the processing gas supply 70 at least in a period during which the energy beam is irradiated to the wafer W. The gas exhaust controller 913 is configured to exhaust the gas in the lower portion of the processing chamber 11 by the gas exhaust unit 90 at least in the period during which the energy beam is irradiated to the wafer W.

The rotation controller 914 is configured to rotate the wafer W by the rotational driving unit 52 at least in the period during which the energy beam is irradiated to the wafer W. The carry-in/out controller 915 is configured to open or close the gate 20 when the wafer W is carried in or out, and is configured to allow the carried-in wafer W to be held by the holder 51 and is configured to release the holding of the wafer W by the holder 51 when the wafer W is to be carried out.

Figure 8:
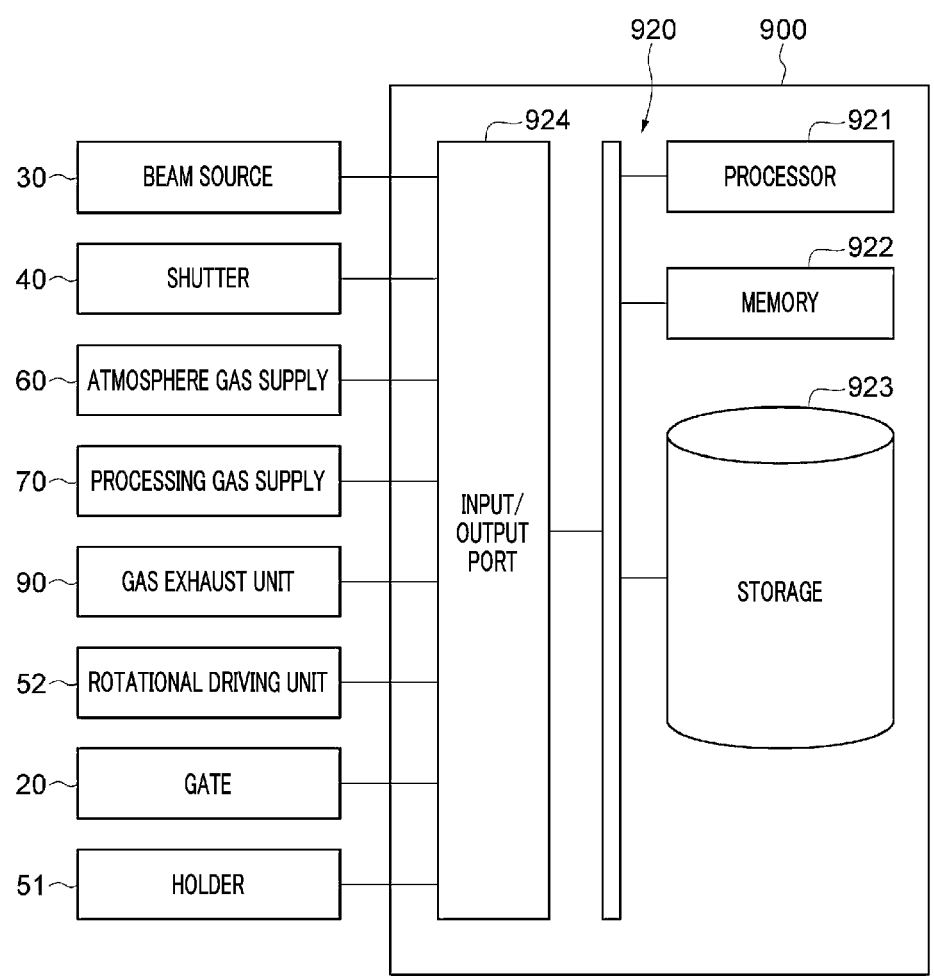
FIG. 8 is a block diagram illustrating an example of a hardware configuration of the controller.

FIG. 8 is block diagram illustrating a hardware configuration of the controller 900. The controller 900 is implemented by one or more control computers. As shown in FIG. 8, the controller 900 is equipped with a circuit 920. The circuit 920 includes at least one processor 921, a memory 922, a storage 923, and an input/output port 924. The storage 923 has a computer-readable recording medium such as, but not limited to, a hard disk. The storage 923 stores therein programs that cause the controller 900 to control the shutter 40 to allow the energy beam to be irradiated to the wafer W within the processing chamber 11 from the beam source 30 through the window members 15, and control the processing gas supply 70 and the gas exhaust unit 90 to allow the inert gas to be discharged from the gas discharge units 80 along the surfaces of the window members 15 at least in the period during which the energy beam is irradiated to the wafer W.

The memory 922 temporarily stores thereon the programs loaded from the recording medium of the storage 923 and an operation result by the processor 921. The processor 921 constitutes the aforementioned individual functional modules by executing the programs in cooperation with the memory 922. The input/output port 924 performs an input/output of an electric signal between the gate 20, the beam source 30, the shutter 40, the holder 51, the rotational driving unit 52, the atmosphere gas supply 60, the processing gas supply 70 and the gas exhaust unit 90 in response to an instruction from the processor 921.

Further, the hardware configuration of the controller 900 is not limited to constituting the individual functional modules by the programs. By way of example, at least a part of the aforementioned functional modules of the controller 900 may be implemented by a dedicated logical circuit or an ASIC (Application Specific Integrated Circuit) which is an integration of logical circuits.

[Sequence of Light Irradiation]

Now, a sequence of light irradiation performed by the light irradiating device 1 will be explained as an example of a light irradiating method. This sequence includes irradiating the energy beam to the wafer W within the processing chamber 11 from the beam source 30 through the window members 15 provided at the partition wall 13 which separates the processing chamber 11 in which the wafer W is accommodated and the beam source chamber 12 in which the beam source 30 for the energy beam is accommodated; and discharging, at least in the period during which the energy beam is irradiated to the wafer W, the inert gas along the surfaces of the window members 15 from the gas discharge units 80 which are respectively provided around the window members 15 within the processing chamber 11.

Figure 9:
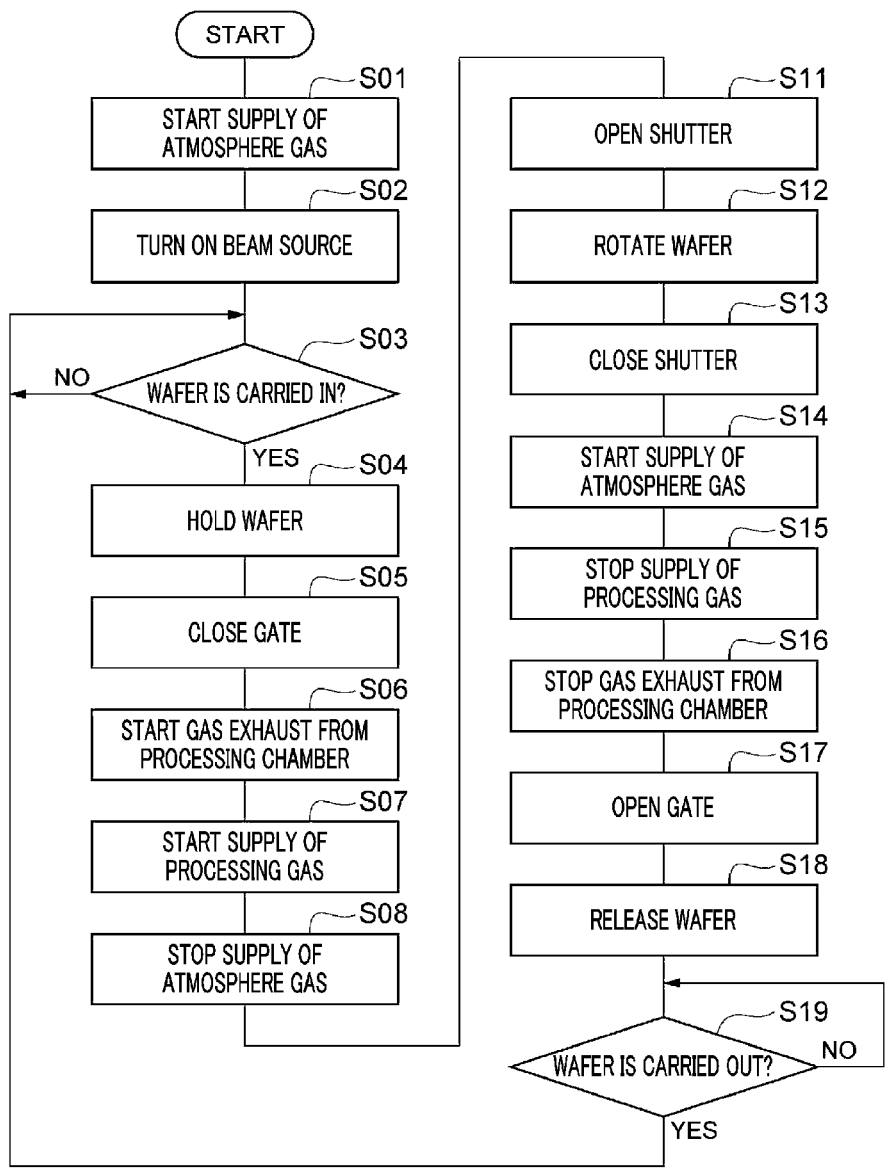
FIG. 9 is a flowchart illustrating an example of a light irradiation sequence.

The sequence shown in FIG. 9 is begun in the state that the carry-in/out opening 14 of the housing 10 is opened by the gate 20. As depicted in FIG. 9, the controller 900 first performs processes S01 and S02. In the process S01, the gas supply controller 912 starts the supply of the atmosphere gas into the beam source chamber 12 by the atmosphere gas supply 60 in the state that the supply of the processing gas by the processing gas supply 70 is stopped. In the process S02, the irradiation controller 911 turns all the beam sources 30 on.

The controller 900 then performs processes S03, S04, S05, S06, S07 and S08 in sequence. In the process S03, the carry-in/out controller 915 waits for the wafer W to be carried into the processing chamber 11 and placed on the holder 51. In the process S04, the carry-in/out controller 915 allows the wafer W to be held by the holder 51. In the process S05, the carry-in/out controller 915 closes the carry-in/out opening 14 by the gate 20. In the process S06, the gas exhaust controller 913 controls the gas exhaust unit 90 to start the exhaust of the gas from the lower portion of the processing chamber 11. In the process S07, the gas supply controller 912 controls the processing gas supply 70 to start the supply of the processing gas into the beam source chamber 12 and the processing gas chamber 11. Accordingly, in each gas discharge unit 80, the discharge of the processing gas along the surface of the window member 15 is begun. In the process S08, the gas supply controller 912 controls the atmosphere gas supply 60 to stop the supply of the atmosphere gas into the beam source chamber 12.

Then, the controller 900 performs processes S11, S12, S13, S14, S15, S16, S17, S18 and S19 in sequence. In the process S11, the irradiation controller 911 switches the shutter 40 from the closed state into the open state. By way of example, the irradiation controller 911 controls the opening/closing driving unit 42 to drive the light blocking plate 41 such that the light transmission openings 43 are located under the beam sources 30. Accordingly, the irradiation of the energy beam to the wafer W within the processing chamber 11 is begun. In the process S12, the rotation controller 914 controls the rotational driving unit 52 to rotate the wafer W within the processing chamber 11 at a preset rotation number.

In the process S13, the irradiation controller 911 switches the shutter 40 from the open state to the closed state. By way of example, the irradiation controller 911 controls the opening/closing driving unit 42 to move the light blocking plate 41 such that the portions of the light blocking plate 41 without the light transmission openings 43 are located under the beam sources 30. Accordingly, the irradiation of the energy beam to the wafer W within the processing chamber 11 is stopped.

In the process S14, the gas supply controller 912 controls the atmosphere gas supply 60 to supply the atmosphere gas into the beam source chamber 12. In the process S15, the gas supply controller 912 controls the processing gas supply 70 to stop the supply of the processing gas into the beam source chamber 12 and the processing chamber 11. In the process S16, the gas exhaust controller 913 controls the gas exhaust unit 90 to stop the exhaust of the gas from the lower portion of the processing chamber 11.

In the process S17, the carry-in/out controller 915 opens the carry-in/out opening 14 by the gate 20. In the process S18, the carry-in/out controller 915 controls the holder 51 to release the holding of the wafer W. In the process S19, the carry-in/out controller 915 waits for the wafer W to be carried out from the processing chamber 11. Then, the controller 900 returns the processing back to the process S03. Thereafter, while the beam sources 30 are maintained on, the replacement of the wafer W and the light irradiation are repeated.

Effects of Exemplary Embodiments

As stated above, the light irradiating device 1 includes the processing chamber 11 for accommodating the wafer W therein; the beam source chamber 12 for accommodating the beam sources 30 for the energy beam; the partition wall 13 configured to separate the processing chamber 11 and the beam source chamber 12; the plurality of window members 15 provided at the partition wall 13 to transmit the energy beam outputted from the beam sources 30 toward the wafer W within the processing chamber 11; and the plurality of gas discharge units 80 respectively provided around the plurality of window members 15 within the processing chamber 11 and configured to discharge the inert gas along the surfaces of the window members 15.

According to this light irradiating device 1, an air flow is compulsively formed along the surfaces of the window members 15 by the inert gas discharged from the gas discharge units 80 disposed around the window members 15. Accordingly, the sublimate produced by the irradiation of the energy beam is suppressed from adhering to the window members 15. Further, it is expected that the sublimate adhering thereto can be removed. Therefore, stability of the light irradiating processing can be improved effectively.

Figure 10:
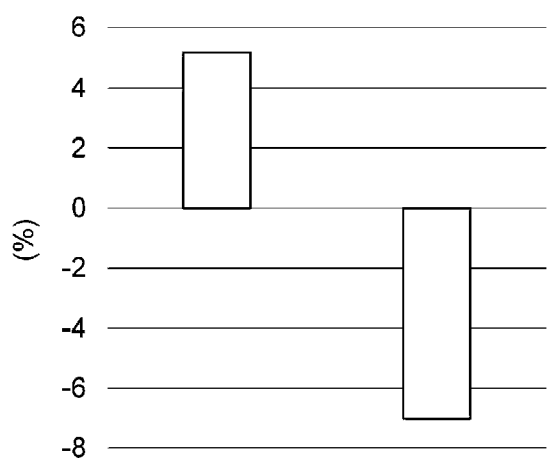
FIG. 10 is a graph showing an effect of adhesion of a sublimate to a window member.

FIG. 10 presents graphs showing an influence of the adhesion of the sublimate to the window members 15. These graphs show an effect of roughness improvement by percentage. The graph on the left-hand side of FIG. 10 shows a state before the sublimate adheres to the window members 15, and the graph on the right-hand side of FIG. 10 shows a state after the sublimate adheres to the window members 15. As can be seen from the graphs of FIG. 10, the effect of roughness improvement is greatly reduced in the case that the sublimate adheres to the window members 15. If the sublimate adheres thereto, a light amount of the energy beam irradiated to the wafer W is reduced, and, besides, a spectrum distribution of the energy beam irradiated to the wafer W is changed. This is deemed to be a reason why the effect of roughness improvement is reduced greatly. As stated above, according to the light irradiating device 1, since the adhesion of the sublimate to the window members 15 is suppressed, the deterioration of the effect of roughness improvement as shown in FIG. 10 is suppressed.

Each of the plurality of gas discharge units 80 may be disposed to surround a corresponding one of the plurality of window members 15 and discharge the inert gas toward the center 15a of the window member 15 from a periphery thereof. In this case, as the inert gas is gathered at the center 15a of the window member 15, an air flow distancing away from the surface of the window member 15 is further produced. Therefore, the adhesion of the sublimate or the like to the window member 15 is further suppressed.

Each of the plurality of gas discharge units 80 may have the surrounding member 81 provided at the partition wall 13 to surround the surface of the window member 15; the buffer space 82 provided within the surrounding member 81 to surround the surface of the window member 15; and the slit 83 opened to the inner peripheral surface of the surrounding member 81 along the periphery of the surface of the window member 15 to allow the inert gas to be discharged toward the center 15a of the window member 15 from the buffer space 82. In this case, by allowing the inert gas to be once gathered in the buffer space 82, non-uniformity in a discharge amount of the inert gas in the circumferential direction of the window member 15 is suppressed. Therefore, the adhesion of the sublimate or the like to the window member 15 can be suppressed further securely.

The light irradiating device 1 is further equipped with the processing gas supply 70 configured to supply the inert gas into the beam source chamber 12, and each of the plurality of gas discharge units 80 may be further provided with the vent hole 84 provided at the partition wall 13 to introduce the inert gas into the buffer space 82 from the beam source chamber 12. In this case, by using the beam source chamber 12 as the gas flow passage for the inert gas, the apparatus configuration can be simplified.

The light irradiating device 1 may be further equipped with at least one gas flow passage 16 which is formed along the partition wall 13 and through which the inert gas is supplied into the buffer spaces 82 of the plurality of gas discharge units 80; and the processing gas supply 70 configured to supply the inert gas into the gas flow passage 16. In this case, by providing the dedicated gas flow passage 16 along the partition wall 13, the flow of the gas from the beam source chamber 12 into the processing chamber 11 is suppressed. Accordingly, since introduction of foreign substances into the processing chamber 11 from the beam source chamber 12 is also suppressed, placement of the driving units such as the shutter 40 in the beam source chamber 12 is eased.

Each of the plurality of gas discharge units 80 may have the buffer space 82; and the buffer space 85 formed within the surrounding member to surround the buffer space 82. In this configuration, the gas flow passage 16 may be connected to the buffer space 85 at at least one position, and the buffer space 82 and the buffer space 85 may be connected at the multiple positions surrounding the surface of the window member 15. In this case, due to the presence of the buffer space 85, pressure non-uniformity in the circumferential direction of the window member 15 is reduced. Further, since the inert gas is introduced into the buffer space 82 via the buffer space 85 from the multiple positions surrounding the window member 15, the pressure non-uniformity in the circumferential direction of the window member 15 is further reduced in the buffer space 82. Accordingly, the non-uniformity in the discharge amount of the inert gas in the circumferential direction of the window member 15 is further suppressed, so that the adhesion of the sublimate or the like to the window member 15 can be suppressed more securely.

The light irradiating device 1 may be further equipped with the gas exhaust unit 90 configured to guide the inert gas gathered at the center 15a of the window member 15 from each gas discharge units 80 toward the wafer W within the processing chamber 11 to thereby allow the inert gas to be exhausted to the outside of the processing chamber 11. In this case, since the formation of the air flow distancing away from the surface of the window member 15 is further accelerated, the adhesion of the sublimate or the like to the window member 15 can be further suppressed.

Besides, in the processing using the vacuum ultraviolet light, the supply of the inert gas and the decompression of the processing chamber may be frequently required. By using a source for the inert gas, which is originally required, when supplying the inert gas to the gas discharge units and by using a decompression source, which is originally required, for the exhaust from the gas exhaust unit, the apparatus can be fabricated reasonably.

So far, the exemplary embodiments have been described. However, the present disclosure is not limited to the exemplary embodiments, and various changes and modifications may be made without departing from the scope of the present disclosure. The processing target substrate is not limited to the semiconductor wafer, and may be, by way of non-limiting example, a glass substrate, a mask substrate, a FPD (Flat Panel Display), or the like.

According to the exemplary embodiment, it is possible to provide the light irradiating device capable of improving stability of a light irradiating processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A light irradiating device, comprising:
a processing chamber in which a substrate is accommodated;
a beam source chamber in which a beam source of an energy beam is accommodated;
a partition wall configured to partition the processing chamber and the beam source chamber;
multiple window members provided at the partition wall to transmit the energy beam outputted from the beam source toward the substrate within the processing chamber; and
multiple gas discharge units respectively disposed around the multiple window members within the processing chamber, and configured to discharge an inert gas along surfaces of the multiple window members,
wherein each of the multiple gas discharge units comprises:
a surrounding member provided at the partition wall to surround a surface of at least one window member of the multiple window members;
a buffer space provided within the surrounding member to surround the surface of the at least one window member; and
a slit opened to an inner peripheral surface of the surrounding member along a periphery of the surface of the at least one window member to allow the inert gas to be discharged from the buffer space toward a center of the at least one window member,
wherein the slit is a gap between the at least one window member and the surrounding member.

2. The light irradiating device of claim 1, further comprising:
a gas supply configured to supply the inert gas into the beam source chamber,
wherein each of the multiple gas discharge units further comprises a vent hole formed at the partition wall to allow the inert gas to be introduced into the buffer space from the beam source chamber.

3. The light irradiating device of claim 1, further comprising:
at least one gas flow passage which is formed along the partition wall and through which the inert gas is supplied into the buffer space of each of the multiple gas discharge units; and
a gas supply configured to supply the inert gas into the gas flow passage.

4. The light irradiating device of claim 3,
wherein each of the multiple gas discharge units comprises a first buffer space as the buffer space, and a second buffer space formed within the surrounding member to surround the first buffer space,
the gas flow passage is connected to the second buffer space at at least one position, and
the first buffer space and the second buffer space are connected to each other at multiple positions surrounding the surface of the window member.

5. The light irradiating device of claim 1, further comprising:
a gas exhaust unit configured to exhaust the inert gas to an outside of the processing chamber by guiding the inert gas, which is gathered at the center of the at least one window member from each of the multiple gas discharge units, toward the substrate within the processing chamber.

6. A light irradiating method, comprising:
irradiating an energy beam to a substrate within a processing chamber from a beam source through multiple window members provided at a partition wall which partitions the processing chamber in which the substrate is accommodated and a beam source chamber in which the beam source of the energy beam is accommodated; and
discharging, at least in a period during which the energy beam is irradiated to the substrate, an inert gas along surfaces of the multiple window members from a slit of each of multiple gas discharge units respectively provided around the multiple window members within the processing chamber,
wherein each of the multiple gas discharge units comprises:
a surrounding member provided at the partition wall to surround the surface of at least one window member of the multiple window members; and
a buffer space provided within the surrounding member to surround the surface of the at least one window member,
wherein the slit is opened to an inner peripheral surface of the surrounding member along a periphery of the surface of the at least one window member to allow the inert gas to be discharged from the buffer space toward a center of the at least one window member,
wherein the slit is a gap between the at least one window member and the surrounding member.

7. A non-transitory computer-readable recording medium having stored thereon computer-executable instructions that, in response to execution, cause an apparatus to perform a light irradiating method as claimed in claim 6.

* * * * *